United States Patent
Masunaga et al.

(10) Patent No.: US 9,318,661 B2
(45) Date of Patent: Apr. 19, 2016

(54) SEMICONDUCTOR LIGHT EMITTING DEVICE AND METHOD FOR MANUFACTURING THE SAME

(75) Inventors: Kumi Masunaga, Kanagawa-ken (JP); Ryota Kitagawa, Tokyo (JP); Eishi Tsutsumi, Kanagawa-ken (JP); Akira Fujimoto, Kanagawa-ken (JP); Koji Asakawa, Kanagawa-ken (JP); Takanobu Kamakura, Kanagawa-ken (JP); Shinji Nunotani, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 225 days.

(21) Appl. No.: 13/038,154

(22) Filed: Mar. 1, 2011

(65) Prior Publication Data

US 2012/0061712 A1    Mar. 15, 2012

(30) Foreign Application Priority Data

Sep. 9, 2010    (JP) .................. 2010-202471

(51) Int. Cl.
*H01L 33/00*    (2010.01)
*H01L 33/38*    (2010.01)
*H01L 33/40*    (2010.01)

(52) U.S. Cl.
CPC ................ *H01L 33/38* (2013.01); *H01L 33/40* (2013.01)

(58) Field of Classification Search
USPC ......... 257/79, 81, 97–99, 102, 130, 613, 615, 257/745, 762, 768, 918, E33.067, E33.068; 438/22, 26, 29, 46, 47; 315/291; 362/97.1
See application file for complete search history.

(56) References Cited

U.S. PATENT DOCUMENTS

| 6,258,618 | B1 | 7/2001 | Lester |
| 6,291,839 | B1 * | 9/2001 | Lester .............................. 257/91 |
| 2009/0079322 | A1 | 3/2009 | Tsutsumi et al. |
| 2009/0211783 | A1 | 8/2009 | Tsutsumi et al. |
| 2009/0242925 | A1 * | 10/2009 | Kitagawa et al. ................. 257/99 |
| 2009/0278158 | A1 * | 11/2009 | Fukunaga ............... H01L 33/42 257/99 |

FOREIGN PATENT DOCUMENTS

JP    2000-058908 A    2/2000

OTHER PUBLICATIONS

III-V Semiconductor Compounds, M. Neuberger, Springer US, 1971, pp. 66-76.*

(Continued)

*Primary Examiner* — Meiya Li
(74) *Attorney, Agent, or Firm* — Oblon, McClelland, Maier & Neustadt, L.L.P

(57) ABSTRACT

A semiconductor light emitting device includes a first semiconductor layer of a first conductivity type, a first electrode layer, a light emitting layer, a second semiconductor layer, a third semiconductor layer and a second electrode layer. The first electrode layer includes a metal portion having a plurality of opening portions. The opening portions penetrate the metal portion and have an equivalent circle diameter of a shape of the opening portions. The light emitting layer is between the first semiconductor layer and the first electrode layer. The second semiconductor layer of a second conductivity type is between the light emitting layer and the first electrode layer. The third semiconductor layer of a second conductivity type is between the second semiconductor layer and the first electrode layer. The second electrode layer is connected to the first semiconductor layer.

10 Claims, 8 Drawing Sheets

(56) References Cited

OTHER PUBLICATIONS

U.S. Appl. No. 13/037,914, filed Mar. 1, 2011, Kitagawa et al.
U.S. Appl. No. 13/037,864, filed Mar. 1, 2011, Kitagawa et al.
U.S. Appl. No. 13/037,990, filed Mar. 1, 2011, Asakawa et al.
U.S. Appl. No. 13/037,937, filed Mar. 1, 2011, Fujimoto et al.
U.S. Appl. No. 12/712,693, filed Feb. 25, 2010, Fujimoto et al.
U.S. Appl. No. 12/876,318, Unknown, Unknown.
Office Action issued on Apr. 23, 2013 in the counterpart Japanese Patent Application No. 2010-202471 (with English Translation).
U.S. Appl. No. 13/221,319, filed Aug. 30, 2011, Masunaga, et al.
Office Action issued Sep. 10, 2013 in Japanese Patent Application No. 2010-202471 (with English language translation).
U.S. Appl. No. 14/543,942, filed Nov. 18, 2014, Masunago, et al.
Japanese Office Action issued Sep. 9, 2014 in Japanese Patent Application No. 2010-202471 (with English language translation).

* cited by examiner 191,192,193

202

110,111,112,113

202

20

SEMICONDUCTOR LIGHT EMITTING DEVICE AND METHOD FOR MANUFACTURING THE SAME

CROSS-REFERENCE TO RELATED APPLICATIONS

This application is based upon and claims the benefit of priority from the prior Japanese Patent Application No. 2010-202471, filed on Sep. 9, 2010; the entire contents of which are incorporated herein by reference.

FIELD

Embodiments described herein relate generally to a semiconductor light emitting device and a method for manufacturing the same.

BACKGROUND

A semiconductor light emitting device includes an electrode that is in ohmic contact with a surface of a semiconductor layer. A semiconductor light emitting device can be made to emit light by passing a current through this electrode. For lighting devices and the like a relatively large light emitting device is desired. Therefore, a semiconductor light emitting device, wherein a fine wire electrode is added extending from a pad electrode along the surface of the semiconductor layer, can be considered. Also, a semiconductor light emitting device wherein a metal electrode is applied to all light emitting surfaces, and ultrafine nanometer (nm) scale opening portions are formed on the metal electrode can be considered. In these semiconductor light emitting devices, further brightness is required.

DETAILED DESCRIPTION

Figure 1:
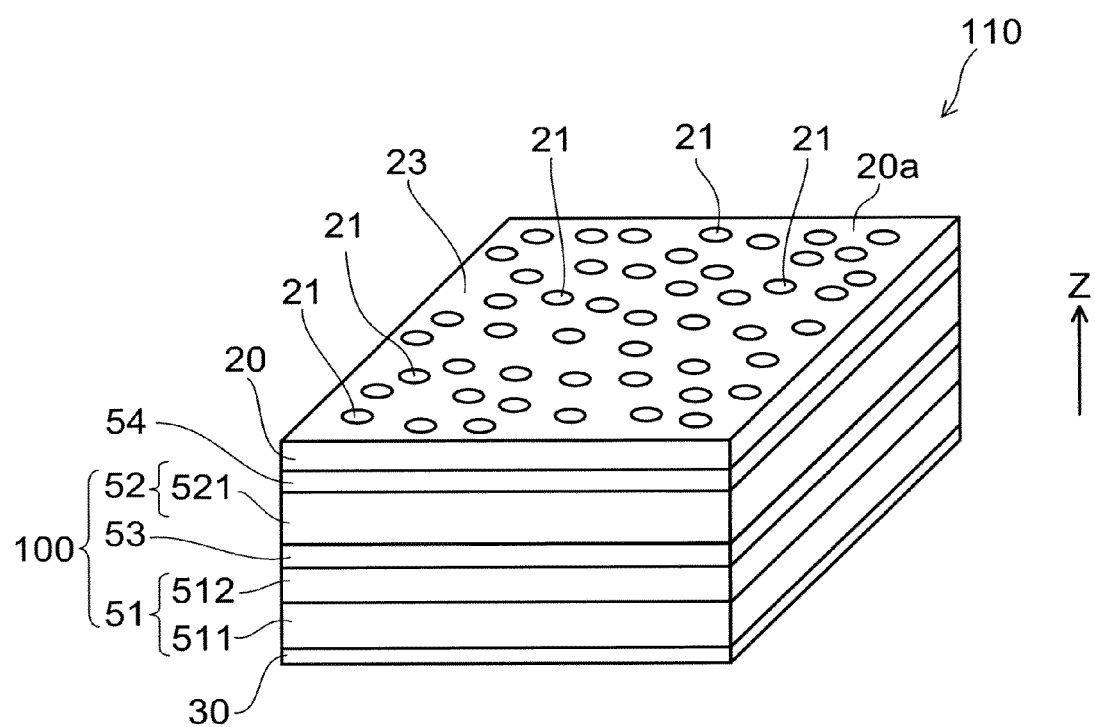
FIG. 1 is a schematic perspective view illustrating a semiconductor light emitting device.

In general, according to one embodiment, a semiconductor light emitting device includes a first semiconductor layer of a first conductivity type, a first electrode layer, a light emitting layer, a second semiconductor layer, a third semiconductor layer and a second electrode layer. The first electrode layer includes a metal portion having a plurality of opening portions. The metal portion has a thickness of not less than 10 nanometers and not more than 50 nanometers along a direction from the first semiconductor layer toward the first electrode layer. The opening portions penetrate the metal portion along the direction and each have an equivalent circle diameter of a shape of the opening portions when viewed along the direction. The equivalent circle diameter is not less than 10 nanometers and not more than 5 micrometers. The light emitting layer is provided between the first semiconductor layer and the first electrode layer. The second semiconductor layer of a second conductivity type is provided between the light emitting layer and the first electrode layer. The third semiconductor layer of a second conductivity type is provided between the second semiconductor layer and the first electrode layer and has a sheet resistance value of not less than $10^3$ ohms/square and not more than $10^6$ ohms/square. The second electrode layer is connected to the first semiconductor layer.

In general, according to one embodiment, a semiconductor light emitting device includes a first semiconductor layer of a first conductivity type, a first electrode layer, a light emitting layer, a second semiconductor layer, a third semiconductor layer and a second electrode layer.

The first electrode layer includes a metal portion having a plurality of opening portions. The metal portion has a thickness of not less than 10 nanometers and not more than 50 nanometers along a direction from the first semiconductor layer toward the first electrode layer. The opening portions penetrate the metal portion along the direction and have an equivalent circle diameter of a shape of the opening portions when viewed along the direction. The equivalent circle diameter is not less than 10 nanometers and not more than 5 micrometers. The light emitting layer is provided between the first semiconductor layer and the first electrode layer. The second semiconductor layer of a second conductivity type is provided between the light emitting layer and the first electrode layer. The third semiconductor layer of a second conductivity type is provided between the second semiconductor layer and the first electrode layer and has an impurity concentration of not less than $1 \times 10^{12}$/cubic centimeters and less than $1 \times 10^{19}$/cubic centimeters. The second electrode layer is connected to the first semiconductor layer.

A method is disclosed for manufacturing a semiconductor light emitting device. The method can include forming a structure body including a first semiconductor layer of a first conductivity type, a second semiconductor layer of a second conductivity type, and a light emitting layer provided between the first semiconductor layer and the second semiconductor layer. The method can include forming a third semiconductor layer on the second semiconductor layer. The third semiconductor layer has an impurity concentration of not less than $1 \times 10^{12}$/cubic centimeters and less than $1 \times 10^{19}$/cubic centimeters. The method can include forming a metal layer on the third semiconductor layer. The metal layer has a thickness of not less than 10 nanometers and not more than 50 nanometers along a direction from the first semiconductor layer toward the second semiconductor layer. The method can include forming a mask pattern on the metal layer. In addition, the method can include forming an electrode layer on the third semiconductor layer by etching the metal layer using the mask pattern as a mask. The electrode layer has a plurality of opening portions with an equivalent circle diameter of not less than 10 nm and not more than 1 micrometer.

Various embodiments will be described hereinafter with reference to the accompanying drawings.

Note that the drawings are schematic or simplified illustrations and relationships between thicknesses and widths of parts and proportions in size between parts may differ from actual parts. Also, even where identical parts are depicted, mutual dimensions and proportions may be illustrated differently depending on the drawing.

Note that in the drawings and specification of the application, the same numerals are applied to elements similar to those described above with reference to the previous drawings, and the detailed descriptions thereof are omitted.

Also, in the following description, specific examples are given as examples wherein a first conductivity type is n-type, and a second conductivity type is p-type.

First Embodiment

FIG. 1 is a schematic perspective view illustrating the configuration of a semiconductor light emitting device according to a first embodiment.

A semiconductor light emitting device 110 according to the first embodiment includes a structure body 100, a third semiconductor layer 54, a first electrode layer 20, and a second electrode layer 30.

The structure body 100 includes a first semiconductor layer 51 of a first conductivity type, a second semiconductor layer 52 of a second conductivity type, and a light emitting layer 53 provided between the first semiconductor layer 51 and the second semiconductor layer 52.

The first semiconductor layer 51 includes a cladding layer 512 made of, for example, n-type InAlP. The cladding layer 512 is formed on a substrate 511 of, for example, n-type GaAs. In the embodiment, for convenience the substrate 511 is included in the first semiconductor layer 51.

The second semiconductor layer 52 is provided between the first semiconductor layer 51 and the first electrode layer 20. The second semiconductor layer 52 includes a cladding layer 521 made of, for example, p-type InAlP. The light emitting layer 53 is provided between the first semiconductor layer 51 and the first electrode layer 20. Specifically, the light emitting layer 53 is provided between the first semiconductor layer 51 and the second semiconductor layer 52. In the semiconductor light emitting device 110, a heterostructure is formed from, for example, the cladding layer 512 of the first semiconductor layer 51, the light emitting layer 53, and the cladding layer 521 of the second semiconductor layer 52.

The first electrode layer 20 is provided on a side of the second semiconductor layer 52 opposite to the first semiconductor layer 51. The first electrode layer 20 is based on, for example Au and Ag, or Au and Ag having some impurities added, as described later.

In the embodiment, for convenience of description, the second semiconductor layer 52 side of the structure body 100 is defined as a front side or top side, and the first semiconductor layer 51 side of the structure body 100 is defined as a reverse side or bottom side. Also, a direction from the first semiconductor layer 51 toward the second semiconductor layer 52 along a stacking direction is defined as a "Z-axis direction".

The first electrode layer 20 includes a metal portion 23 and a plurality of opening portions 21.

A thickness of the metal portion 23 along the Z-axis direction is, for example, not less than 10 nm and not more than 50 nm.

The plurality of opening portions 21 penetrate the metal portion 23 along the Z-axis direction. Equivalent circle diameters of each of the plurality of opening portions 21 are not less than 10 nm and not more than 5 μm.

Here, the equivalent circle diameter is defined by the following equation (1).

$$\text{Equivalent circle diameter} = 2 \times (\text{Area}/\pi)^{1/2} \quad (1)$$

An "Area" in the above equation is the area of the shape of an opening portion 21 when viewed from the Z-axis direction.

The opening portions 21 are not necessarily circular shaped. Therefore, in the embodiment, the opening portions 21 are specified using the definition of the equivalent circle diameter.

The second electrode layer 30 has electrical continuity with the first semiconductor layer 51. In this example, the second electrode layer 30 is provided on the reverse side of the structure body 100. Au, for example, is used for the second semiconductor layer 30.

The third semiconductor layer 54 is provided between the second semiconductor layer 52 and the first electrode layer 20. The third semiconductor layer 54 is in contact with the first electrode layer 20. The third semiconductor layer 54 has the second conductivity type.

In the semiconductor light emitting device 110 according to the embodiment, a sheet resistance value of the third semiconductor layer 54 is more than or equal to $10^3$ Ω/square, and less than or equal to $10^6$ Ω/square.

Also, in the semiconductor light emitting device 110 according to the embodiment, an impurity concentration in the third semiconductor layer 54 is more than or equal to $1 \times 10^{12}$ cm$^{-3}$, and less than $1 \times 10^{19}$ cm$^{-3}$.

In this type of semiconductor light emitting device 110, a face on which the first electrode layer 20 is formed is mainly used as a light emitting face. In other words, by applying a predetermined voltage between the first electrode layer 20 and the second electrode layer 30, light having a predetermined center wavelength is emitted from the light emitting layer 53. This light is mainly extracted to an outside from a major surface 20a of the first electrode layer 20. In the embodiment, the face from which the light of the semiconductor light emitting device 110 is extracted is referred to as the light extraction face.

In the semiconductor light emitting device 110 according to the embodiment, the third semiconductor layer 54 is provided between the second semiconductor layer 52 and the first electrode layer 20, thus it is possible to inject sufficient current to the light emitting layer 53 along the Z-axis direction while maintaining a spread of current to the light emitting layer 53 due to the first electrode layer 20 which includes the ultrafine opening portions 21.

According to the semiconductor light emitting device 110 according to the embodiment, a luminous efficiency of the light emitting layer 53 can be improved, and it is possible to increase a brightness of the light emitted from the first electrode layer 20.

Next, an example of the semiconductor light emitting device 110 is described.

The semiconductor light emitting device 110 includes, for example, an n-type GaAs substrate 511, and a heterostructure that includes for example an n-type InAlP cladding layer 512, an InGaAlP light emitting layer 53, and a p-type InAlP cladding layer 521 is formed on the substrate 511.

The light emitting layer 53 may have, for example, a multiple quantum well (MQW) structure wherein alternating barrier layers and well layers are provided repeatedly. Also, the groups of barrier layers sandwiching the well layers may include a single quantum well (SQW) structure provided per group.

A third semiconductor layer 54 made of, for example, p-type GaP is formed on the cladding layer 521. The third semiconductor layer 54, for example, adjusts flow of the current injected from the first electrode layer 20 along the Z-axis direction.

The third semiconductor layer 54 is doped with, for example, impurities of carbon or the like, to make it easier to establish ohmic contact between the third semiconductor layer 54 and the first electrode layer 20.

The first electrode layer 20 is provided on the third semiconductor layer 54 and in contact with the third semiconductor layer 54. The first electrode layer 20 is provided with a stacked metal film of, for example, Au and Au—Zn alloy, as a p-side electrode. A plurality of opening portions 21 are provided in the first electrode layer 20 penetrating the metal portion 23 along the Z-axis direction. A size and arrangement of the opening portions 21 may be regular or may be irregular.

An n-type second electrode layer 30 that includes, for example, Au—Ge alloy is formed on a reverse face of the substrate that is the first semiconductor layer 51. The second electrode layer 30 forms ohmic contact and has electrical continuity with the first semiconductor layer 51.

In the semiconductor light emitting device 110 according to the embodiment, light emitted from the light emitting layer 53 lets out to the outside from a face of the third semiconductor layer 54 on which the first electrode layer 20 is provided.

In the semiconductor light emitting device 110 according to the embodiment, the sheet resistance value of the third semiconductor layer 54 is more than or equal to $10^3$ Ω/square, and less than or equal to $10^6$ Ω/square. The impurity concentration in the third semiconductor layer 54 is more than or equal to $1\times10^{12}$ cm$^{-3}$, and less than $1\times10^{19}$ cm$^{-3}$.

In the semiconductor light emitting device 110, the equivalent circle diameters of the opening portions 21 of the first electrode layer 20 are more than or equal to 10 nm and less than or equal to 5 μm.

In the semiconductor light emitting device 110, the thickness of the metal portion 23 of the first electrode layer 20 along the Z-axis direction is greater than or equal to 10 nm and less than or equal to 50 nm.

Due to this configuration, it is possible to achieve greater brightness in the semiconductor light emitting device 110 according to the embodiment.

The configuration as described above was determined by the present inventors from the following test results.

The inventors of the application carried out tests in which the impurity concentration was changed in the third semiconductor layer 54 of the semiconductor light emitting device 110.

Figure 2A:
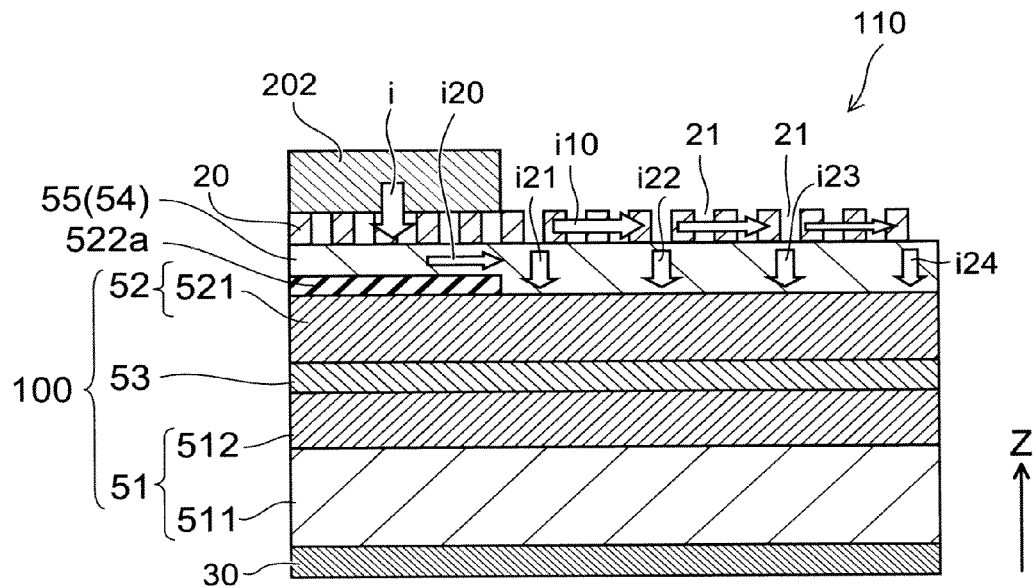
FIGS. 2A and 2B are schematic cross-sectional views illustrating the semiconductor light emitting device.
Figure 2B:
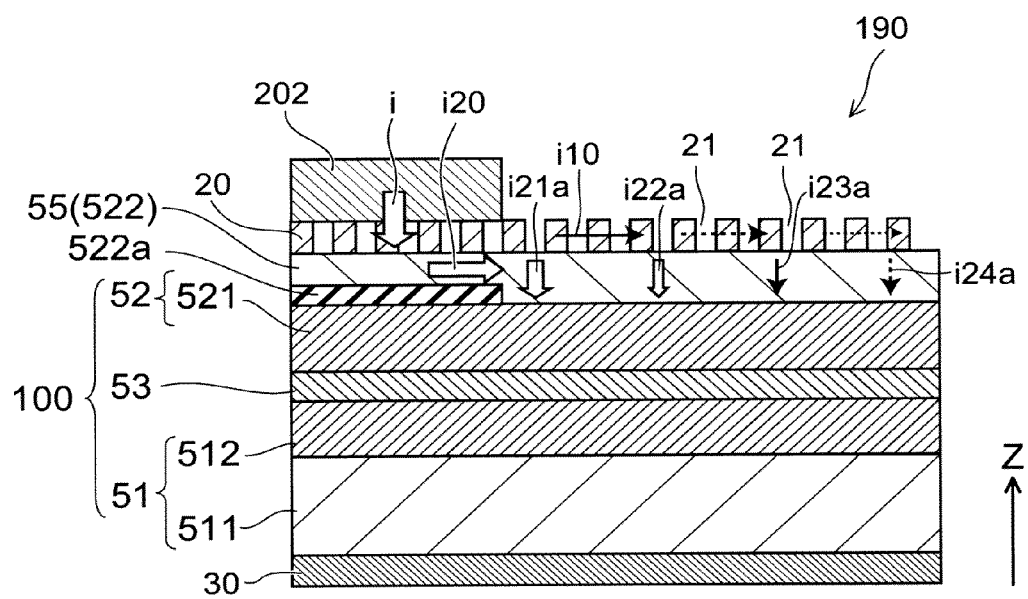

FIGS. 2A and 2B are schematic cross-sectional views illustrating the semiconductor light emitting devices used in the tests.

The inventors of the application provided an intermediate semiconductor layer 55 between the second semiconductor layer 52 and the first electrode layer 20, and carried out tests in which the sheet resistance value of the intermediate semiconductor layer 55 was varied.

FIG. 2A illustrates a schematic cross-sectional view illustrating the semiconductor light emitting device 110 provided with the third semiconductor layer 54 as the intermediate semiconductor layer 55.

FIG. 2B illustrates a schematic cross-sectional view illustrating a semiconductor light emitting device 190 having a current diffusion layer 522 as the intermediate semiconductor layer 55, not the third semiconductor layer 54. The current diffusion layer 522 is provided between the second semiconductor layer 52 and the first electrode layer 20, and forms ohmic contact with the first electrode layer 20.

In both of these drawings, a part of one side is illustrated with a pad electrode 202 as the center.

The inventors of the application fabricated the semiconductor light emitting device 110 and 190 illustrated in FIGS. 2A and 2B.

In the semiconductor light emitting device 110 shown in FIG. 2A, the sheet resistance value of the third semiconductor layer 54 is $1.0\times10^4$ Ω/square.

In the semiconductor light emitting device 190 shown in FIG. 2B, the sheet resistance value of the current diffusion layer 522 is $2.0\times10^2$ Ω/square.

A current block layer 522a is provided below the pad electrode 202 in both the semiconductor light emitting devices 110 and 190.

The semiconductor light emitting devices 110 and 190 were inspected for variations in the light intensity within the light extraction face and overall brightness. As a result, it was found that the light intensity within the light extraction face of the semiconductor light emitting device 110 achieved more uniformity than that of the semiconductor light emitting device 190. The brightness of the semiconductor light emitting device 110 was also higher than that of the semiconductor light emitting device 190.

When the sheet resistance value of the layer 55 is low, for example in the device of FIG. 2B by virtue of the current diffusion layer 522, current flows more easily through the current diffusion layer 522, so it is normally considered that variation in the light intensity within the light extraction face results by the spread of the current. For example, in a configuration wherein an ordinary wire electrode or the like is used as the electrode in contact with the second semiconductor layer 52, efforts were made to reduce the sheet resistance value of the layer 55 (for example, by using the current diffusion layer 522), for the purpose of allowing the current to flow efficiently between wire electrodes.

However, according to the results of the tests carried out by the inventors of the application, the opposite result was obtained. In other words, the higher the sheet resistance of the layer 55, the better the result.

The inventors of the application inferred that the mechanism that produced these test results was as follows.

As illustrated in FIGS. 2A and 2B, in the semiconductor light emitting devices 110 and 190, a current i injected from the pad electrode 202 can be divided into a current i10 flowing through the first electrode layer 20 and a current i20 flowing through the intermediate semiconductor layer 55 (the third semiconductor layer 54 or the current diffusion layer 522).

Here, in the device of FIG. 2B of semiconductor light emitting device 190, the sheet resistance value of the current diffusion layer 522 is lower than the sheet resistance value of the third semiconductor layer 54, so the current flowing through the first electrode layer 20 can easily flow into the current diffusion layer 522. Therefore, the larger a distance from the pad electrode 202, the smaller the current flowing through the current diffusion layer 522 along the Z-axis direction (i21a to i24a).

On the other hand, in the device of FIG. 2A of semiconductor light emitting device 110, the sheet resistance value of the third semiconductor layer 54 is higher than the sheet resistance value of the current diffusion layer 522, so it is difficult for the current flowing through the first electrode layer 20 to flow into the third semiconductor layer 54. Therefore, the amount of the current flowing from the first electrode layer 20 into the third semiconductor layer 54 (a total of i21 to i24) becomes less dependent on a distance from the pad electrode 202. In other words, the amount of the current flowing through the third semiconductor layer 54 in the Z-direction (a total of i21 to i24) is more uniform compared with the amount of the current flowing through the current diffusion layer 522 along the Z-axis direction (a total of i21a to i24a).

Therefore, by providing the third semiconductor layer 54 between the first electrode layer 20 and the second semiconductor layer 52, it is considered that it is possible to suppress the variation in light intensity within the light extraction face. Also, it is considered that by making the current flowing through the third semiconductor layer 54 along the Z-axis direction more uniform, it is possible to improve the overall brightness of the semiconductor light emitting device 110.

Based on the above knowledge, the inventors of the application set the configuration of the embodiment of FIG. 1. In other words, it was found that the sheet resistance value of the third semiconductor layer 54 should be more than or equal to $10^3$ Ω/square, and less than or equal to $10^6$ Ω/square. The impurity concentration in the third semiconductor layer 54 corresponding to the above sheet resistances is more than or equal to $1 \times 10^{12}$ cm$^{-3}$, and less than $1 \times 10^{19}$ cm$^{-3}$.

The current in the first electrode layer 20 having the opening portions 21 is preferably 100 times or more than that of the third semiconductor layer 54. Therefore, if the sheet resistance value of the third semiconductor layer 54 is Rss, and the sheet resistance value of the first electrode layer 20 is Rms, the inequality Rss≥100×Rms is preferably satisfied.

Also, Rms=(resistivity of the first electrode layer 20)/(thickness along the Z-axis direction of the first electrode layer 20).

If the resistivity of the first electrode layer 20 is about $10^{-7}$ Ω·cm, and the thickness along the Z-axis direction of the first electrode layer 20 is more than or equal to 10 nm, an upper bound of Rms is 10 Ω/square.

Therefore, a lower bound on the sheet resistance value of the third semiconductor layer 54, Rss, is $10^3$ Ω/square.

On the other hand, it is desirable that ⅒th or more of the current injected from the pad electrode 202 flows into the third semiconductor layer 54, from the pad electrode 202 to a point separated by 1 cm along a direction normal to the Z-axis direction. This is in order to inject sufficient current to the light emitting layer 53.

Therefore, within a width of 1 cm along a direction normal to the Z-axis direction from the pad electrode 202, (resistance value of the third semiconductor layer 54 along the Z-axis direction)≤10×(resistance value of the first electrode layer 20) is preferably satisfied.

In other words, Rss≤Rms/(thickness ts of the third semiconductor layer 54 along the Z-axis direction)$^2$)×$10^{-3}$ is preferably satisfied.

If the resistivity of the first electrode layer 20 is about $10^{-7}$Ω·m, for example $2\times10^{-8}$Ω·m, and if the thickness of the first electrode layer 20 along the Z-axis direction is 50 nm or less, the lower bound of Rms is 0.4 Ω/square. Also, the thickness ts is in the range 10 nm through 20 μm.

Therefore, the upper bound of the sheet resistance value Rss of the third semiconductor layer 54 is $10^6$ Ω/square.

The sheet resistance value of the third semiconductor layer 54 can be directly measured, or it can be calculated by measuring the impurity concentration and a film thickness (a thickness along the Z-axis direction) of the third semiconductor layer 54.

The impurity concentration can be easily measured by a method such as analysis of a cross-section by secondary ion mass spectroscopy (SIMS).

Preferably the dopant for doping the third semiconductor layer 54 includes one of C, Ca, Ge, Mg, Mn, Se, Si, Sn, Te, and Zn.

The film thickness of the third semiconductor layer 54 is more than or equal to 10 nm, and less than or equal to 20 μm.

More preferably the film thickness of the third semiconductor layer 54 is more than or equal to 10 nm, and less than or equal to 5 μm.

If the film thickness of the third semiconductor layer 54 is more than or equal to 10 nm and less than or equal to 20 μm, the impurity concentration of the third semiconductor layer 54 that correspond to the sheet resistance value of the third semiconductor layer 54 ($10^3$ Ω/square or more, $10^6$ Ω/square or less) is $1\times10^{12}$ cm$^{-3}$ or higher, and less than $1\times10^{19}$ cm$^{-3}$.

By providing the third semiconductor layer 54 as described above, it is possible to inject sufficient current to the light emitting layer 53 along the Z-axis direction in the semiconductor light emitting device 110 according to the embodiment, while maintaining the spread of current toward the light emitting layer 53 by the first electrode layer 20 which includes the plurality of opening portions 21. Therefore, it is possible to improve the luminous efficiency of the light emitting layer 53, and increase the brightness of the light emitted from the first electrode layer 20.

Also, in the semiconductor light emitting device 110, high heat dissipation is obtained by providing the comparatively large first electrode layer 20, so a temperature rise of the semiconductor light emitting device 110 is suppressed. Also, the temperature rise of the semiconductor light emitting device 110 is suppressed by adjusting a size (for example the equivalent circle diameter) of the opening portions 21 provided in the first electrode layer 20. In other words, a series resistance is reduced by lowering a forward direction voltage of the semiconductor light emitting device 110, so that heat generation can be reduced.

In order to realize this effect, the current should flow from the first electrode layer 20 with the opening portions 21 uniformly over the whole face of the second semiconductor layer 52. In order that the current can flow uniformly to the second semiconductor layer 52, sizes of each of the opening portions 21 and gaps between the centers of the opening portions 21 are limited to a certain extent.

The extent of current spread in the third semiconductor layer 54 is up to about 5 μm from an edge of the first electrode layer 20 as obtained from simulation, although this depends on a doping concentration of the semiconductor through which the current flows. In other words, if the diameter of the opening portions 21 is larger than 5 μm, an area over which the current does not flow may result, and it is not possible to reduce the voltage in the forward direction because of the series resistance. Therefore, the upper bound of the equivalent circle diameter of the opening portions 21 is 5 μm or less, and preferably 1 μm or less.

Here, by providing opening portions 21 that are sufficiently smaller than a wavelength of the light emitted from the light emitting layer 53, the first electrode layer 20 may function as a light transmitting electrode, even though it is metal. This is because the straight line distance of the continuous metal portions that are not obstructed by opening portions 21 is sufficiently shorter than the wavelength of the light. That is, when the light illuminates the first electrode layer 20, the movement of free electrons induced by an electric field of the light is obstructed, so the metal becomes transparent to the corresponding light wavelength.

In Drude's theory, which describes reflections in metals, a material under consideration is assumed to be a uniform structure that is sufficiently large relative to the wavelength of the incident light. When a substance is irradiated with light having a frequency that is lower than a plasma frequency, what happens to the motion of the free electrons within the substance is that electrons within the substance are polarized by the electric field of the light. This polarization is induced in a direction to cancel out the electric field of the light. By blocking the electric field of the light as the result of the induced polarization of the electrons, the light cannot transmit the substance, and a plasma reflection occurs. Here, if the substance that is irradiated with light is sufficiently smaller than the wavelength of light, a motion of the electrons is restricted by a geometric structure, so it is considered that blocking of the electric field of the light is not possible. This can be achieved by the structure that the diameter of the opening portions and a distance between the adjacent opening portions are sufficiently smaller than the wavelength of the light. Here, the distance is an average value of the distance between the centers of two adjacent structures, for example opening portions.

Therefore, in order to obtain a higher transmittance of the first electrode layer 20 than an opening ratio, preferably the equivalent circle diameter is less than or equal to ½ of the center wavelength of the light, where a transmittance of the first electrode layer 20 means a transmittance of the light generated in the light emitting layer 53 emitted to the outside, and an opening ration means a ratio of the area of the opening portions 21 to the area of the first electrode layer 20. For example, in the case of visible light, the equivalent circle diameter of the opening portions 21 should be less than or equal to 300 nm.

Also, a gap between adjacent opening portions 21 should preferably be, for example, 20 nm or more, and 400 nm or less, from the point of view of transmittance of the light.

Also, it is particularly preferable that the upper bound of the equivalent circle diameter of the opening portions 21 is 0.9 P or less from the viewpoint of electrical conductivity, where P is the gap between adjacent opening portions 21. Specifically, 360 nm or less is preferable. On the other hand, although there is no limitation on the lower bound of the equivalent circle diameter of the opening portions 21 from the viewpoint of electrical conductivity, for structural simplicity the lower bound should be 10 nm or more, and preferably 30 nm or more.

Preferably the metal material of the metal portion 23 of the first electrode layer 20 is, for example, a metal based on at least one of Ag and Au. Thereby, absorption loss of light emitted from the light emitting layer 53 is suppressed. In addition, the metal material of the metal portion 23 is preferably formed of at least one material selected from the group of Al, Zn, Zr, Si, Ge, Pt, Rh, Ni, Pd, Cu, Sn, C, Mg, Cr, Te, Se, and Ti, or an alloy that includes two or more selected from this group. Thus, an ohmic property, interface adhesion property and heat resistance property are improved. Preferably the metal used as the material of the metal portion 23 has sufficient electrical conductivity and thermal conductivity. However, the embodiment is not limited to these, and any metal can be used.

An arbitrary point of the metal portions 23 of the first electrode layer 20, that is the part where the opening portions 21 are not provided, are continuous from the current supply sources such as the pad electrode and so on. This is to obtain a low resistance value by electrical continuity.

Also, if a plurality of current supply sources are provided, each current supply source is only necessary to be continuous with its corresponding metal portion 23 of the first electrode layer 20.

Also, the sheet resistance of the first electrode layer 20 is preferably 10 Ω/square or less, and more preferably 5 Ω/square or less. The smaller the sheet resistance, the smaller the heat generated in the semiconductor light emitting device 110, and uniform light generation in a large area can be obtained, and the increase in brightness is more distinct.

Also, ohmic contact and electrical continuity is formed between the first electrode layer 20 and the third semiconductor layer 54. For example, in the case of a red light emitting device, after forming a stacked structure of Au and Au—Zn alloy (Zn is the dopant of the p-type second semiconductor layer 52) on a semiconductor layer of GaAs, GaP, or other compounds, ohmic contact may be produced by doping the metal-semiconductor interface with Zn by heat treatment.

In the semiconductor light emitting device 110, the metal layer is formed in a similar way, and the first electrode layer 20 is formed by forming the opening portions 21 by a method that is described later. Here, if the thickness of the first electrode layer 20 is too thin, the amount of dopant is too small, and doping is insufficient. As a result, sufficient ohmic contact cannot be obtained, and this could cause the resistance value to increase.

As a result of investigations by test examinations, it was found that if the thickness of the first electrode layer 20 is 10 nm or more, it is possible to achieve sufficient ohmic contact. Also, if the thickness of the first electrode layer 20 is 30 nm or more, the interface ohmic property is further improved. On the other hand, the greater the thickness of the first electrode layer 20, the lower the resistance value. In accordance with the perspective of transmittance of the light emitted from the light emitting layer 53, the thickness of the first electrode layer 20 is preferably 1 μm or less, and more preferably 50 nm or less.

Here, a reflectance, that is bulk reflectance of the first electrode layer 20 with respect to the light emitted from the light emitting layer 53, may be 70% or higher. This is because the light is converted into heat which causes losses by high absorptance in a metal with low reflectance. In the first electrode layer 20, reflected light can be reused by providing a reflection layer (not shown in the drawings) or the like below the light emitting layer 53, so the light can be extracted again if the light is not converted into heat. Thereby, the light emitted from the light emitting layer 53 passes through the first electrode layer 20.

By providing the third semiconductor layer 54 as described above, it is possible to inject sufficient current to the light emitting layer 53 along the Z-axis direction in the semiconductor light emitting device 110, while maintaining the spread of current toward the light emitting layer 53 by the first electrode layer 20 which includes the plurality of opening portions 21. Therefore, it is possible to improve the luminous efficiency of the light emitting layer 53, increase the brightness of the light emitted from the first electrode layer 20, and improve the brightness uniformity within the light extraction face.

The following is an description of a method for manufacturing a semiconductor light emitting device.

Figure 3:
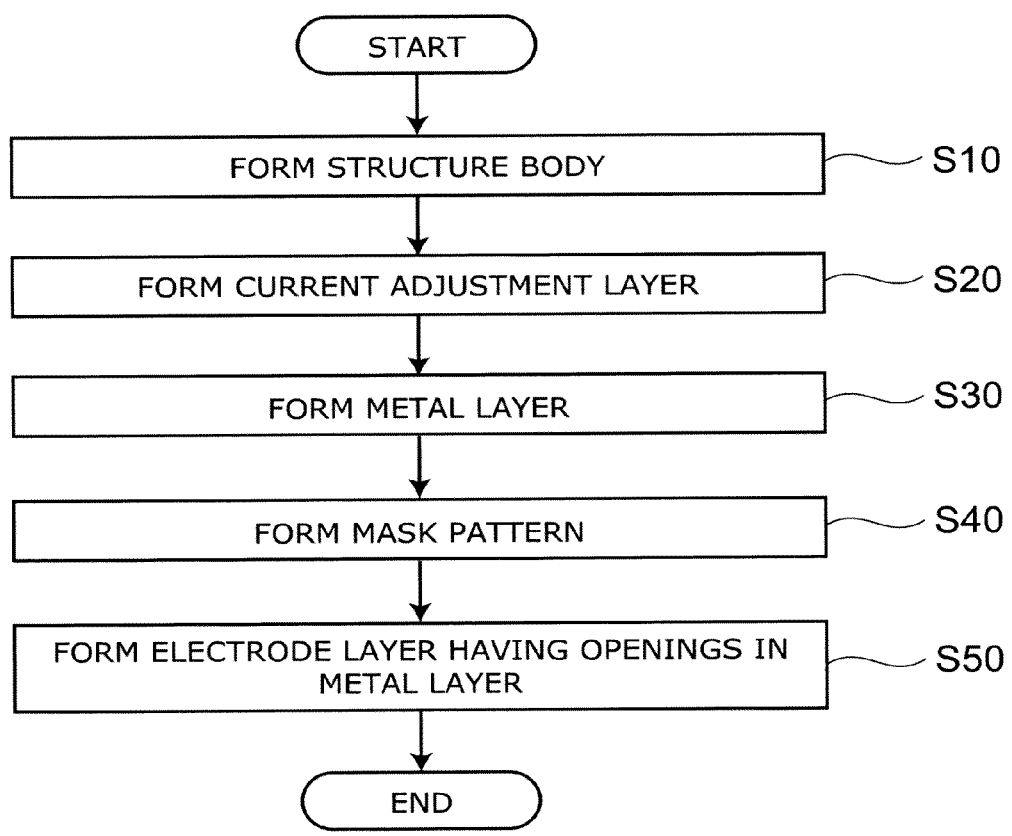
FIG. 3 is a flowchart illustrating a method of manufacturing a semiconductor light emitting device.

FIG. 3 is a flowchart illustrating the method for manufacturing a semiconductor light emitting device.

Specifically, in FIG. 3 the method for manufacturing the semiconductor light emitting device includes: forming a structural body by forming the first semiconductor layer 51, forming the light emitting layer 53 on the first semiconductor layer 51, and forming the second semiconductor layer 52 on the light emitting layer 53 (Step S10); forming the third semiconductor layer 54 on the second semiconductor layer 52 with an impurity concentration of $1 \times 10^{12}$ cm$^{-3}$ or higher, and less than $1 \times 10^{19}$ cm$^{-3}$ (Step S20); forming a metal layer on the third semiconductor layer 54 with a thickness along the Z-axis direction of 10 nm or more and 50 nm or less (Step S30); forming a mask pattern on the metal layer (Step S40); and forming an electrode layer (first electrode layer 20) having a plurality of opening portions 21 with equivalent circle diameters 10 nm or larger and 5 µm or smaller by etching the metal layer using the mask pattern as the mask (Step S50).

Specifically, the manufacturing method can be as follows.

(A) Method Using a Mold

One method for manufacturing a semiconductor light emitting device according to the embodiment is to use a mold.

Specifically, the semiconductor light emitting device can be obtained as follows, for example.

FIGS. 4A to 4F are schematic cross-sectional views illustrating an example of a process of the method using a mold.

Figure 4A:
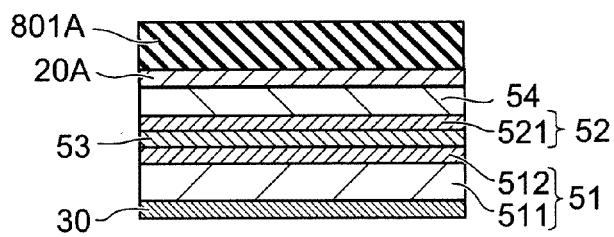
FIGS. 4A to 4F and 5A to 5F are schematic cross-sectional views illustrating methods for manufacturing a semiconductor light emitting device.

As illustrated in FIG. 4A, first the light emitting layer 53 is formed on the first semiconductor layer 51, and the second semiconductor layer 52 is formed on the light emitting layer 53. Also, the second electrode layer 30 is formed in contact with the first semiconductor layer 51.

Next, the third semiconductor layer 54 is formed on the second semiconductor layer 52, and a metal layer 20A is formed on the third semiconductor layer 54. Then a resist layer 801A is formed on the metal layer 20A.

Figure 4E:
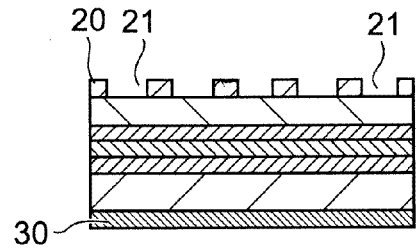
Figure 4B:
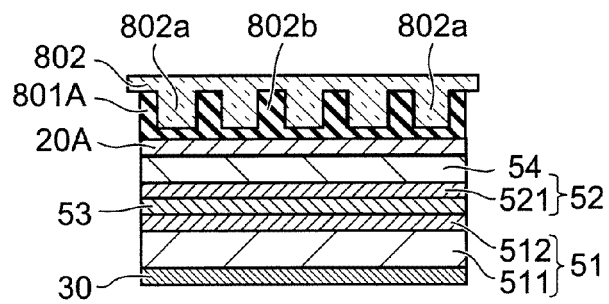

Next, a mold 802 is prepared having protrusions 802a as illustrated in FIG. 4B. In one case, the mold 802 is provided with a plurality of protrusions 802a on a transfer face. The plurality of protrusions 802a are discontinuous. Depressions 802b are provided between the plurality of protrusions 802a.

The mold 802 can be manufactured by forming a desired structure in quartz, for example, by electron beam lithography. There are no limitations on the material of the mold 802 and a method of forming the fine protrusion and depression structures of the mold 802. For example, the mold 802 can be formed by a method using the self-assembly of block copolymers or a mask formed of fine-particles.

Next, as illustrated in FIG. 4B, a surface of the mold 802 having the protrusions is pressed into the resist layer 801A to perform imprinting, with the resist layer 801A heated to a predetermined temperature if necessary. After being cooled down to room temperature (curing), the mold 802 is separated from the resist layer 801A. In this way, as illustrated in FIG. 4C, a resist pattern 801B is formed having depressions corresponding to the protrusions 802a.

Figure 4F:
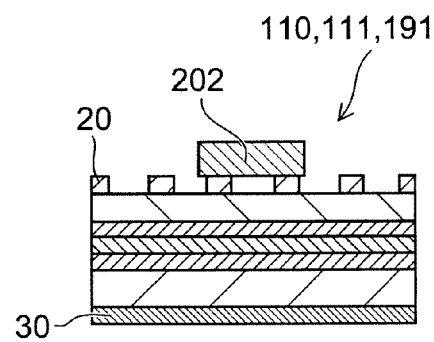
Figure 4C:
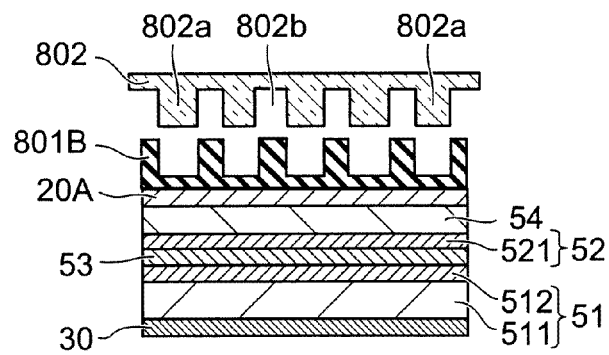
Figure 4D:
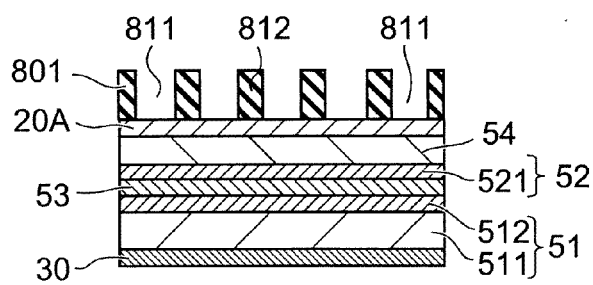

Next, as illustrated in FIG. 4D, the resist pattern 801B is etched. Thereby, bottoms of the depressions of the resist pattern 801B are removed, and the metal layer 20A is exposed. Portions where the metal layer 20A is exposed become resist openings 811.

Next, the metal layer 20A is etched by ion milling using the resist pattern 801 as a mask in which the resist openings 811 have been formed. Thereby, as illustrated in FIG. 4E, the opening portions 21 are formed in the metal layer 20A corresponding to the resist openings 811. The metal layer 20A becomes the first electrode layer 20 when the opening portions 21 are formed. After etching the metal layer 20A, the resist pattern 801 is removed.

Finally, as illustrated in FIG. 4F, the pad electrode 202 is formed, to complete the semiconductor light emitting device 110.

The method of using a mold is not limited to thermoplastic techniques as described above, but various technologies may be used, such as patterning by curing the resist with light irradiation, patterning by a mold with flexibility such as PDMA (poly dimethylacrylamide), or the like.

(B) Method Using the Self-Assembly of Block Copolymers

Another method for manufacturing a semiconductor light emitting device is to use phase separation by the self-assembly of block copolymers.

Specifically, the semiconductor light emitting device can be obtained as follows, for example.

FIGS. 5A to 5F are schematic cross-sectional views illustrating an example of a process of the method using the self-assembly of block copolymers.

Figure 5A:
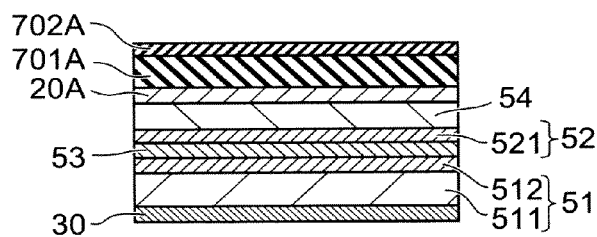

As illustrated in FIG. 5A, first the light emitting layer 53 is formed on the first semiconductor layer 51, and the second semiconductor layer 52 is formed on the light emitting layer 53. Also, the second electrode layer 30 is formed in contact with the first semiconductor layer 51.

Next, the third semiconductor layer 54 is formed on the second semiconductor layer 52, and a metal layer 20A is formed on the third semiconductor layer 54.

Next, a resist layer 701A is formed on the metal layer 20A. Then a spin on glass (SOG) layer 702A is formed on the resist layer 701A.

Figure 5E:
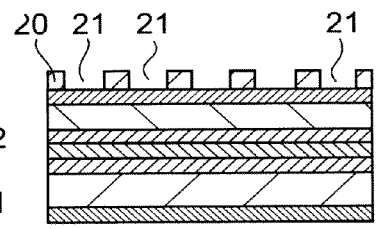
Figure 5B:
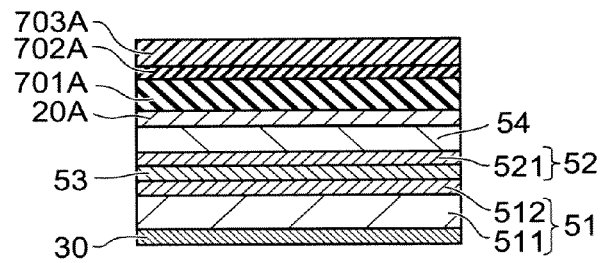

Next, as illustrated in FIG. 5B, a solvent in which block copolymers having two types of polymer block are dissolved is applied to the top of the SOG layer 702A by the spin coating method. Then, pre-baking is carried out to remove the solvent and to form a block copolymer layer 703A. Then the block copolymer layer 703A is annealed. Thereby, phase separation of the two types of polymer is carried out, as illustrated in FIG. 5C, and a dot pattern 703 is formed by one type of polymer.

Next, the dot pattern 703 is etched using a reactive ion etching (RIE) method. Here, due to the difference in the etching rates of the two types of polymer, the site of a polymer with the faster etching rate become a hole pattern after RIE.

Figure 5F:
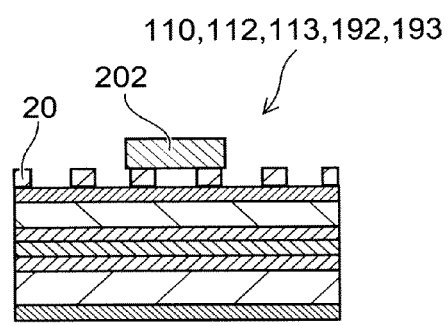
Figure 5C:
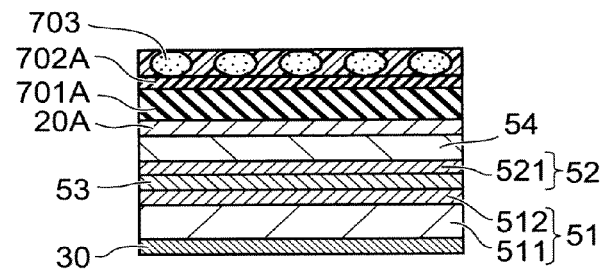
Figure 5D:
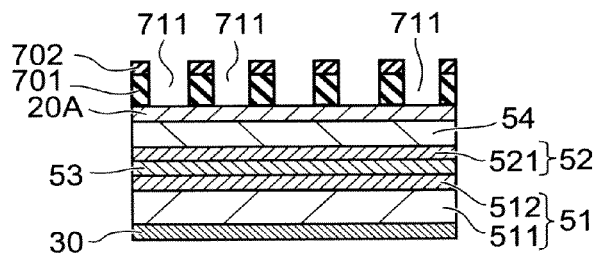

Next, the SOG layer 702A is etched, for example by RIE method using the hole pattern from the polymer as a mask, and the SOG hole pattern 702 is formed as illustrated in FIG. 5D. Next, a resist hole mask 701 is formed by RIE method with the SOG hole pattern 702 as a mask. Resist openings 711 are provided in the resist hole mask 701.

Next, ion milling is carried out and the metal layer 20A is etched using the SOG hole pattern 702 and the resist hole mask 701 as masks. Thereby, as illustrated in FIG. 5E, the metal layer 20A that exits right below the resist openings 711 is etched, and the opening portions 21 are formed in the metal layer 20A. The metal layer 20A becomes the first electrode layer 20 when the opening portions 21 are formed. After etching the metal layer 20A, the SOG hole pattern 702 and the resist hole mask 701 are removed.

Finally, as illustrated in FIG. 5F, the pad electrode 202 is formed, to complete the semiconductor light emitting device 110.

The methods for manufacturing a semiconductor light emitting device are not limited to the methods as described above. For example, a method wherein the mask pattern is manufactured by electron beam lithography and the metal layer 20A is etched using this mask pattern, or a method wherein the metal layer 20A is etched using a monolayer of fine particles such as silica or the like as the mask, may be used.

Next, examples are described. The materials, values, manufacturing conditions, and so on indicated in the following examples are examples, and the invention is not limited to these examples.

First Example

In a first example, a semiconductor light emitting device 111 according to the process illustrated in FIGS. 4A-4F is manufactured in accordance with the method using a mold as described in (A) above.

First, as illustrated in FIG. 4A, a heterostructure that includes the n-type InAlP cladding layer 512, the AlInGaP light emitting layer 53, the p-type InAlP cladding layer 521, and so on formed on the n-type GaAs substrate 511 was formed. On top of this, the p-type GaP third semiconductor layer 54 was epitaxially grown. At this time, the impurity concentration in the third semiconductor layer 54 was $2.0\times10^{16}$ cm$^{-3}$.

Next, the second electrode layer 30, for example, an n-type opposing electrode, was formed on the reverse face of the substrate 511. As an example, an Au—Ge alloy film was formed with a film thickness of 150 nm. The Au—Ge alloy film was formed by vacuum vapor deposition, as an example. Then, annealing was carried out in a nitrogen atmosphere for 30 minutes at 450° C., to obtain ohmic contact between the second electrode layer 30 and the substrate 511. Next, the metal layer 20A containing for example AgCu (Cu content 1%, thickness 30 nm) was formed on the third semiconductor layer 54 by vapor deposition. Then, annealing was carried out in a nitrogen atmosphere for 30 minutes at 350° C., to obtain ohmic contact between the metal layer 20A and the third semiconductor layer 54.

Next, resist solution was applied on top of the metal layer 20A. The resist solution is a solution of resist (THMR-iP3250, Tokyo Ohka Kogyo Co., Ltd.) diluted 1:2 in ethyl lactate (EL). The resist solution was spin coated for 30 seconds at 2000 rpm. Then the solvent of the resist solution was evaporated by heating for 90 seconds at 110° C. on a hot plate. The film thickness of the resist layer 801A was 150 nm, as an example.

Next, as illustrated in FIG. 4B, a quartz mold 802 was prepared having protrusions 802a with equivalent circle diameter; 200 nm, gaps; 300 nm, and height; 150 nm, as an example. Then with the resist layer on the substrate heated to 120° C., the surface of the mold 802 with the protrusions 802a was pressed into the resist layer 801A with 10 MPa pressure, for example.

Then, as illustrated in FIG. 4C, the substrate was cooled to room temperature and the mold 802 was released. Thereby, depressions with 200 nm equivalent circle diameter, 300 nm gaps, and 100 nm depth were formed on the resist layer 801A.

Next, the resist pattern 801B on which the depression pattern was formed was etched by O$_2$-RIE for 30 seconds under conditions of O$_2$ flow rate 30 sccm, pressure 1.33 Pa (10 mTorr), and RF power 100 W (Watts). As a result of this etching, the bottoms of the depressions of the resist were removed, as illustrated in FIG. 4D, and the resist pattern 801 having resist openings 811 was formed.

Next, etching on the metal layer 20A was carried out using this resist pattern 801 as the mask. For the etching, an ion milling apparatus was used. Etching was carried out for 90 seconds under the conditions of acceleration voltage 500V, and ion current 40 mA. Thereby, the first electrode layer 20 with the opening portions 21 was formed, as illustrated in FIG. 4E.

After etching the metal layer 20A, oxygen ashing was carried out to remove the resist pattern 801. Finally, as illustrated in FIG. 4F, the pad electrode 202 was formed. Thereby, the semiconductor light emitting device 111 according to the first example was completed.

In the semiconductor light emitting device 111 according to the first example, the thickness of the first electrode layer 20 along the Z-axis direction of the metal layer 23 was 30 nm, the equivalent circle diameter of the opening portions 21 was 220 nm, the pitch (gap) between adjacent opening portions 21 was 300 nm, the thickness of the third semiconductor layer 54 along the Z-axis direction was 5 μm, and the sheet resistance value of the third semiconductor layer 54 was $2\times10^3$ Ω/square.

First Comparative Example

Also, a semiconductor light emitting device 191 according to a first comparative example was manufactured in accordance with a manufacturing process that is the same as that of the semiconductor light emitting device 111 according to the first example, except that the current diffusion layer 522 was provided instead of the third semiconductor layer 54. Also, in the semiconductor light emitting device 191, the sheet resistance value of the current diffusion layer 522 was $10^2$ Ω/square, and everything else was the same as for the semiconductor light emitting device 111 according to the first example.

For the semiconductor light emitting devices 111 and 191, the variation in the light intensity within the light extraction face and the overall brightness were inspected. Here, the variation in the light intensity within the light extraction face is a difference between the brightness of a brightest part and the brightness of a darkest part within the light extraction face.

The inspections were carried out with singulated chips of the semiconductor light emitting devices 111 and 191. Two sizes of the chips were prepared; one has an area of $9.0\times10^{-2}$ mm$^2$ (length of one side=300 μm) and another has an area of $8.1\times10^{-1}$ mm$^2$ (length of one side=900 μm) in a plane perpendicular to the z-axis. The impressed current was 350 milliamperes (mA).

In the semiconductor light emitting device 111 according to the first example, in the chip with 300 μm per side, the variation in the light intensity within the light extraction face was 0.1%, and in the chip with 900 μm per side, the variation was 4.0%.

In the semiconductor light emitting device 191 according to the first comparative example, in the chip with 300 μm per side, the variation in the light intensity within the light extraction face was 6.2%, and in the chip with 900 μm per side, the variation was 11.2%.

Also, in the case of the chip with 300 μm per side, the overall brightness of the semiconductor light emitting device 111 according to the first example was 1.1 times the overall brightness of the semiconductor light emitting device 191 according to the first comparative example, and was 1.3 times in the case of the chip with 900 μm side.

For both the semiconductor light emitting devices 111 and 191, the same tests were carried out on other two types of chips; one type contains the first electrode layer 20 that includes the opening portions 21 with 10 nm equivalent circle diameter and 16 nm pitch between adjacent opening portions 21, and another type contains the first electrode layer 20 that includes the opening portions 21 with 5 μm equivalent circle diameter and 8 μm pitch between adjacent opening portions 21. In all cases, the results were the same as the above.

Also, when 500 mA current was supplied to the chips with 300 μm per side, the variation in the light intensity within the light extraction face of the semiconductor light emitting device 111 was 0.2%, but in contrast for the semiconductor light emitting device 191, it was 23.9%. At this time, the overall brightness of the semiconductor light emitting device 111 according to the first example was 1.4 times the overall brightness of the semiconductor light emitting device 191 according to the first comparative example.

Also, when 4 Amperes (A) current was supplied to the chips with 900 μm per side, the variation in the light intensity within the light extraction face of the semiconductor light emitting device 111 was 3.9%, but for the semiconductor light emitting device 191, it was 56.6%. At this time, the overall brightness of the semiconductor light emitting device 111 according to the first example was 1.8 times the overall brightness of the semiconductor light emitting device 191 according to the first comparative example.

In this way, by making the light emission uniform in the light extraction face, the result that the brightness was greatly improved was obtained.

Second Example

In a second example, the semiconductor light emitting device 112 is manufactured according to the process illustrated in FIG. 5 in accordance with the method of using the self-assembly of block copolymers as described in (B) above.

First, as illustrated in FIG. 5A, the heterostructure that includes the n-type InAlGaP cladding layer 512, the AlInGaP light emitting layer 53 and the p-type InAlGaP cladding layer 521 was formed on the n-type GaAs substrate 511. On top of this, the p-type AlGaAs third semiconductor layer 54 was epitaxially grown.

Next, the metal layer 20A including Au (thickness 10 nm) and Au—Zn alloy (Zn content 3%, thickness 30 nm) was formed on the third semiconductor layer 54 by vapor deposition as an example. Next, an n-side opposing electrode was formed as the second electrode layer 30 on the reverse face of the substrate 511. As an example, an Au—Ge alloy film was formed to a film thickness of 150 nm. The Au—Ge alloy film was formed by vacuum vapor deposition, as an example. Then, annealing was carried out in a nitrogen atmosphere for 30 minutes at 450° C., to obtain ohmic contact between the metal layer 20A and the third semiconductor layer 54, and between the metal layer 30 and the substrate 511. The wavelength of the light emitted from this semiconductor light emitting device was 571 nm, as an example.

Next, resist solution was applied on top of the metal layer 20A. The resist solution is a solution of resist (THMR-iP3250, Tokyo Ohka Kogyo Co., Ltd.) diluted 1:3 in ethyl lactate (EL). After spin coating this resist solution for 30 seconds at 2000 rpm, it was heated for 90 seconds at 110° C. on a hot plate to evaporate the solvent. Next, annealing was carried out on the resist for one hour at 250° C. in a nitrogen atmosphere, and the resist was thermally cured. The film thickness of the resist layer 701A was 100 nm, as an example.

Next, a solution of organic SOG compound (OCD-T7 T-5500 (product name), Tokyo Ohka Kogyo Co., Ltd.) diluted 1:5 in ethyl lactate (EL) was spin coated for 60 seconds at 2000 rpm on the formed resist layer 701A. After spin coating, baking was carried out for 60 seconds at 110° C. to completely remove the solvent. Then, annealing was carried out for one hour at 250° C. in a nitrogen atmosphere. The film thickness of the SOG layer 702A was 30 nm.

Next, as illustrated in FIG. 5B, a solution containing a block copolymer was applied by the spin coating method for 30 seconds at 3000 rpm. The block copolymer that was used has a block of polystyrene (hereafter referred to as PS) with a molecular weight of 160,000 and a block of polymethylmetacrylate (hereafter referred to as PMMA) with a molecular weight of 45,000. This was then pre-baked for 90 seconds at 110° C. to remove the solvent and a 70 nm film thickness block copolymer layer 703A was obtained.

Then, as illustrated in FIG. 5C, the block copolymer layer 703A was annealed for 4 hours at 210° C. in a nitrogen atmosphere, phase separation of the PS and PMMA was carried out, and a PMMA dot pattern 703 with 40 nm equivalent circle diameter and 60 nm gap was formed.

Next, the phase separated block copolymer film was etched by reactive ion etching method for 10 seconds under the conditions of $O_2$ flow rate 30 sccm, pressure 13.3 Pa (100 mTorr), and power 100 W. Here, the PMMA was selectively etched due to the difference in etching speed of the PS and PMMA, so a PS hole pattern was formed.

Next, the SOG was etched for one minute using an RIE apparatus with the PS hole pattern as the mask, under the conditions of $CF_4$ flow rate 30 sccm, pressure 1.33 Pa (10 mTorr), and power 100 W. Thereby, the SOG hole pattern 702 was formed as illustrated in FIG. 5D.

Next, the resist hole mask 701 was formed by etching for 60 seconds with an RIE apparatus using the SOG hole pattern 702 as the mask, under conditions of $O_2$ flow rate 30 sccm, pressure 1.33 Pa (10 mTorr), and power 100 W.

Next, etching of the metal layer 20A was carried out for 100 seconds using an ion milling apparatus, under the conditions of acceleration voltage 500V and ion current 40 mA. After etching the metal layer 20A, the remaining SOG hole pattern 702 and resist hole mask 701 were removed by oxygen ashing. Thereby, the first electrode layer 20 with the opening portions 21 was formed, as illustrated in FIG. 5E. Finally, as illustrated in FIG. 5F, the pad electrode 202 was formed. Thus, the semiconductor light emitting device 112 according to the second example was completed.

In the semiconductor light emitting device 112 according to the second example, the thickness along the Z-axis direction of the metal portion 23 of the first electrode layer 20 was 40 nm, the equivalent circle diameter of the opening portions 21 was 40 nm, the pitch between adjacent opening portions 21 was 60 nm, the thickness along the Z-axis direction of the third semiconductor layer 54 was 1.5 μm, and the sheet resistance value of the third semiconductor layer 54 was $10^6$ Ω/square.

Second Comparative Example

Also, a semiconductor light emitting device 192 according to a second comparative example was manufactured in accordance with the manufacturing process that is the same as that of the semiconductor light emitting device 112 according to the second example, except that an intermediate semiconductor layer 55 was provided instead of the third semiconductor layer 54. Also, in the semiconductor light emitting device 192, the sheet resistance value of the intermediate semiconductor layer 55 was $10^7$ Ω/square, and everything else was the same as for the semiconductor light emitting device 112 according to the second example.

For the semiconductor light emitting devices 112 and 192, the variation in the light intensity within the light extraction face and the overall brightness were inspected. The inspections were carried out with singulated chips of the semiconductor light emitting devices 112 and 192. Two sizes of the chips were prepared; one has an area of $9.0 \times 10^{-2}$ mm² (one side 300 μm) and another has an area of $8.1 \times 10^{-1}$ mm² (one side 900 μm) in a plane perpendicular to the z-axis. The impressed current was 350 mA.

In the semiconductor light emitting device 112 according to the second example, in the chip with 300 μm per side, the variation in the light intensity within the light extraction face was 0.2%, and in the chip with 900 μm per side, the variation was 2.2%.

In the semiconductor light emitting device 192 according to the second comparative example, the sheet resistance of the current diffusion layer 522 was too high, so it was not possible to form ohmic contact between the first electrode layer and the current diffusion layer 522, so light emission could not be confirmed at the same current and voltage as for the semiconductor light emitting device 112.

For both the semiconductor light emitting devices 112 and 192, the same tests were carried out on other two types of chips; one type contains the first electrode layer 20 that includes the opening portions 21 with 10 nm equivalent circle diameter and 16 nm pitch between adjacent opening portions 21, and another type contains the first electrode layer 20 that includes the opening portions 21 with 5 μm equivalent circle diameter and 8 μm pitch between adjacent opening portions 21. In all cases, the results were the same as the above.

Third Example

A semiconductor light emitting device 113 according to a third example has the same structure as the semiconductor light emitting device 111 according to the first example. Also, a semiconductor light emitting device 193 according to a third comparative example is the same as the semiconductor light emitting device 191 according to the first comparative example.

In the third example, the inspections on the semiconductor light emitting devices 113 and 193 were carried out with a 20 mA current.

In the semiconductor light emitting device 113 according to the third example, in the chip with 300 μm per side, the variation in the light intensity within the light extraction face was 1.1%, and in the chip with 900 μm per side, the variation was 3.2%.

In the semiconductor light emitting device 193 according to the third comparative example, in the chip with 300 μm per side, the variation in the light intensity within the light extraction face was 2.3%, and in the chip with 900 μm per side, the variation was 6.5%.

Also, in the case of the chips with 300 μm per side, the overall brightness of the semiconductor light emitting device 113 according to the third example was 1.03 times the overall brightness of the semiconductor light emitting device 193 according to the third comparative example, and was 1.1 times in the case of the chips with 900 μm per side.

For both the semiconductor light emitting devices 113 and 193, the same inspections were carried out on other two types of chips; one type contains the first electrode layer 20 that includes the opening portions 21 with 10 nm equivalent circle diameter and 16 nm pitch between adjacent opening portions 21, and another type contains the first electrode layer 20 that includes the opening portions 21 with 5 μm equivalent circle diameter and 8 μm pitch between adjacent opening portions 21. In all cases, the results are the same as the above.

Figure 6A:
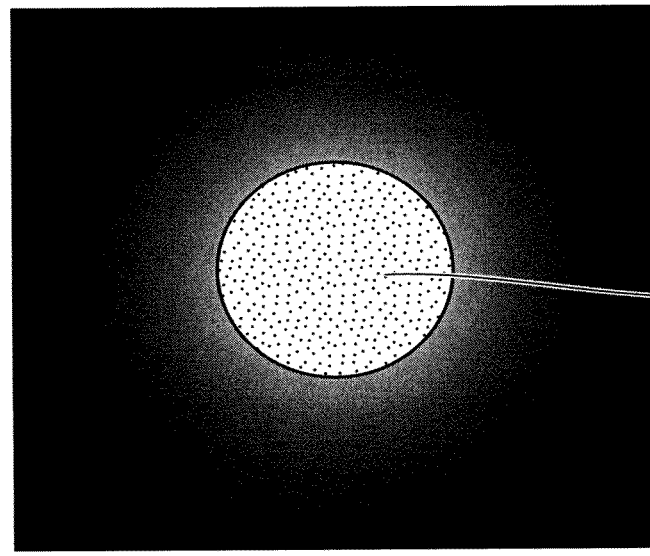
FIGS. 6A and 6B are schematic plan views illustrating the light emitting states of semiconductor light emitting devices.
Figure 6B:
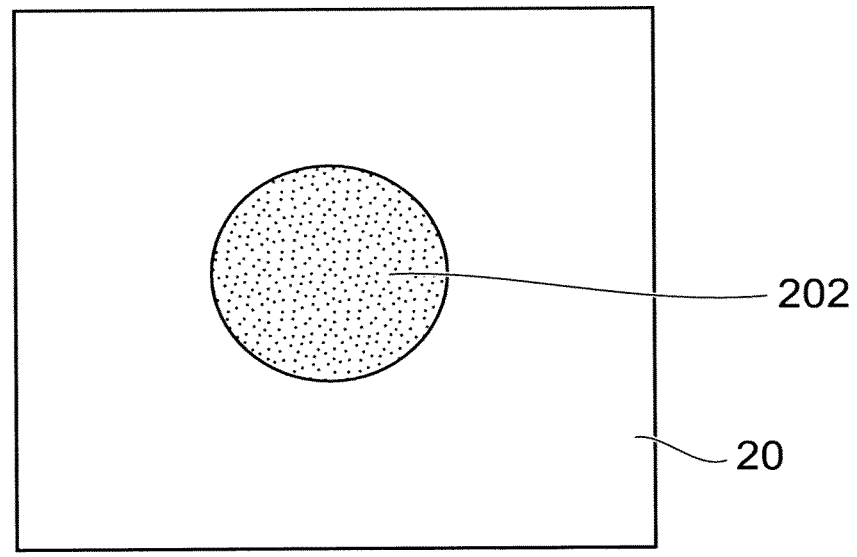

FIGS. 6A and 6B are schematic plan views illustrating light emitting states of semiconductor light emitting devices.

FIG. 6A illustrates the light emitting states of the semiconductor light emitting devices 191, 192, and 193 according to the first to the third comparative examples.

FIG. 6B illustrates the light emitting states of the semiconductor light emitting device 110 according to the first embodiment and semiconductor light emitting devices 111, 112, and 113 according to the first to the third examples.

In both illustrations, black indicates dark point and the lighter tone indicates stronger luminous intensity in the part of the light extraction face, except from the pad electrode 202.

As illustrated in FIG. 6A, in semiconductor light emitting devices 191, 192, and 193, the luminous intensity was strong only near the pad electrode 202, and the farther from the pad electrode 202 the weaker the luminous intensity.

On the other hand, as illustrated in FIG. 6B, in the semiconductor light emitting devices 110, 111, 112, and 113, a uniform luminous intensity was obtained for a whole of the light extraction face, whether near or far from the pad electrode 202.

Fourth Example

Figure 7:
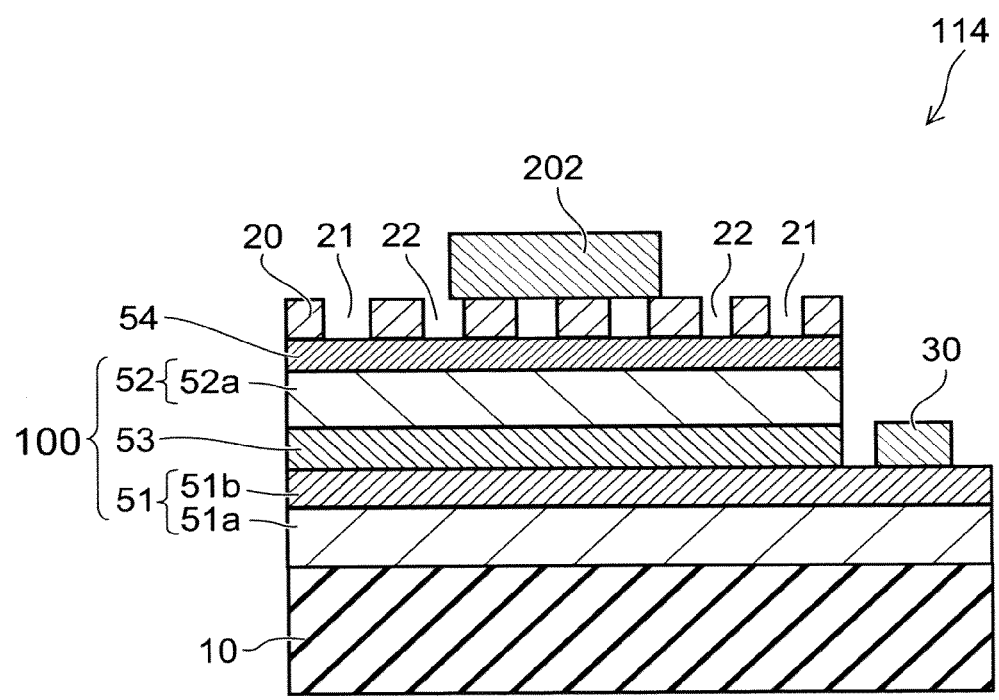
FIG. 7 is a schematic cross-sectional view illustrating a semiconductor light emitting device.

FIG. 7 is a schematic cross-sectional view illustrating a semiconductor light emitting device according to a fourth example.

In a semiconductor light emitting device 114 according to the fourth example, a nitride semiconductor was used as the material of the structure body 100.

Specifically, in the semiconductor light emitting device 114, a GaN buffer layer 51a, an Si-doped n-type GaN layer 51b, an InGaN/GaN light emitting layer 53 having a multi quantum well (MQW) structure, an Mg-doped p-type $Al_{0.2}Ga_{0.8}N$ layer 52a, and a p-type GaN third semiconductor layer 54 were formed by epitaxial growth on a growth substrate 10. A sapphire substrate was used as the substrate 10, as an example.

In the semiconductor light emitting device 114 according to the fourth example, for convenience, the GaN buffer layer 51a and n-type GaN layer 51b were included in the first semiconductor layer 51, and the p-type $Al_{0.2}Ga_{0.8}N$ layer 52a was included in the second semiconductor layer 52.

The metal layer 20A including Ni (thickness of 1 nm) and Ag (thickness of 49 nm) was formed as an example on the third semiconductor layer 54. The Ni and Ag films were formed by vacuum vapor deposition, as an example. Then, annealing was carried out in a nitrogen atmosphere for 30 minutes at 600° C., to obtain ohmic contact between the second electrode layer 30 and the substrate 511. Then, the first electrode layer 20 having a plurality of opening portions 21 was formed in accordance with the mold method, the same as for the first example. The Ni layer is provided for the purpose of ohmic contact, but another material could be used if ohmic contact between the first electrode layer 30 and the third semiconductor layer 54 is possible. For example, Pt or the like could be used instead of Ni. Also, the second electrode layer 30 was provided on the part where the n-type GaN layer 51b is exposed after partially etching of the third semiconductor layer 54, the p-type $Al_{0.2}Ga_{0.8}N$ layer 52a, and the light emitting layer 53.

In the semiconductor light emitting device 114 according to the fourth example, the thickness along the Z-axis direction of the metal portion 23 of the first electrode layer 20 was 50 nm, the equivalent circle diameter of the opening portions 21 was 120 nm, the pitch between adjacent opening portions 21 was 200 nm, the thickness along the Z-axis direction of the third semiconductor layer 54 was 200 nm, and the sheet resistance value of the third semiconductor layer 54 was $10^4$ Ω/square.

For the semiconductor light emitting device 114, the variation in the light intensity within the light extraction face and the overall brightness were inspected. The inspections were carried out with singulated chips of the semiconductor light emitting device 114. Two sizes of the chips were prepared; one has an area of $9.0 \times 10^{-2}$ mm² (one side 300 μm) and another has an area of $8.1 \times 10^{-1}$ mm² (one side 900 μm). The impressed current was 350 mA.

In the semiconductor light emitting device 114 according to the fourth example, in the chip with 300 μm per side, the variation in the light intensity within the light extraction face was 0.8%, and in the chip with 900 μm per side, the variation was 2.8%. In the semiconductor light emitting device 114, by providing the third semiconductor layer 54 as described above, it is possible to obtain uniform light emission within the light extraction face, so it is possible to obtain high brightness.

For the semiconductor light emitting device 114, the same tests were carried out on other two types of chips; one type contains the first electrode layer 20 that includes the opening portions 21 with 10 nm equivalent circle diameter and 16 nm pitch between adjacent opening portions 21, and another type contains the first electrode layer 20 that includes the opening portions 21 with 5 μm equivalent circle diameter and 8 μm pitch between adjacent opening portions 21. In all cases the results are the same as the above.

Fifth Example

In a fifth example, a semiconductor light emitting device 115 was fabricated with the same structure as the first example, however, having the first electrode layer 20 with the opening portions 21 produced by electron beam lithography. In this semiconductor light emitting device 115, the same characteristics are obtained as the first example.

Sixth Example

In a sixth example, a semiconductor light emitting device 116 was fabricated with the same structure as the first example, however, using one of AlGaAs, GaAsP, and GaP as the light emitting layer 53. In the semiconductor light emitting device 116 with one of AlGaAs, GaAsP, and GaP as the light emitting layer 53, the same characteristics were also obtained as the first example.

FIG. 8 is a schematic plan view illustrating the light emitting states of semiconductor light emitting devices.

Figure 8A:
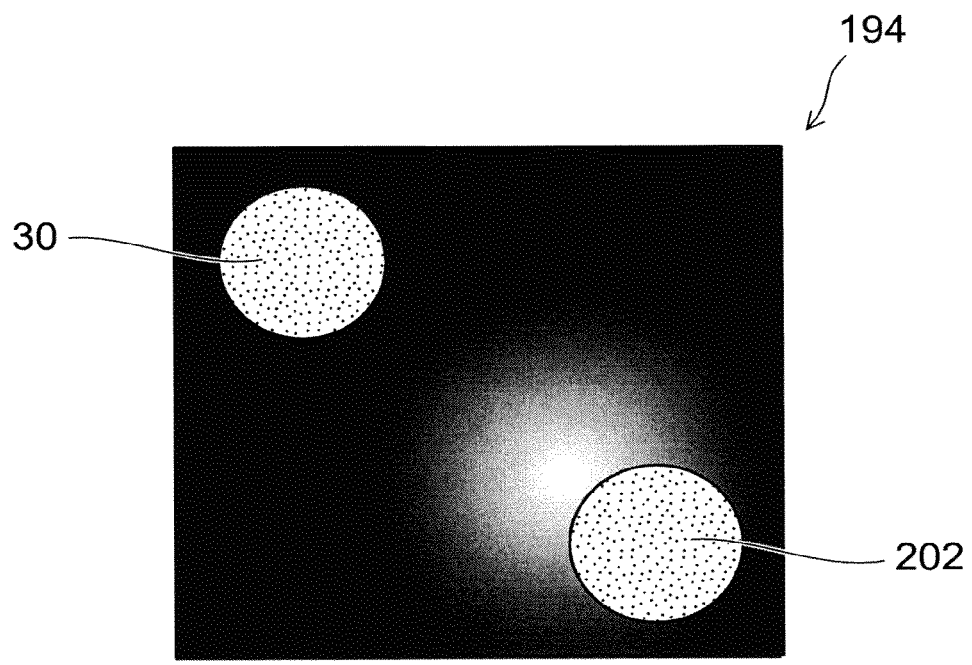
FIGS. 8A and 8B are schematic plan views illustrating the light emitting states of semiconductor light emitting devices.

FIG. 8A illustrates the light emitting state of the semiconductor light emitting device 194 in which the sheet resistance value of the third semiconductor layer 54 is lower [by how much?] than that of the semiconductor light emitting devices 114 to 116 according to the fourth to the sixth examples.

Figure 8B:
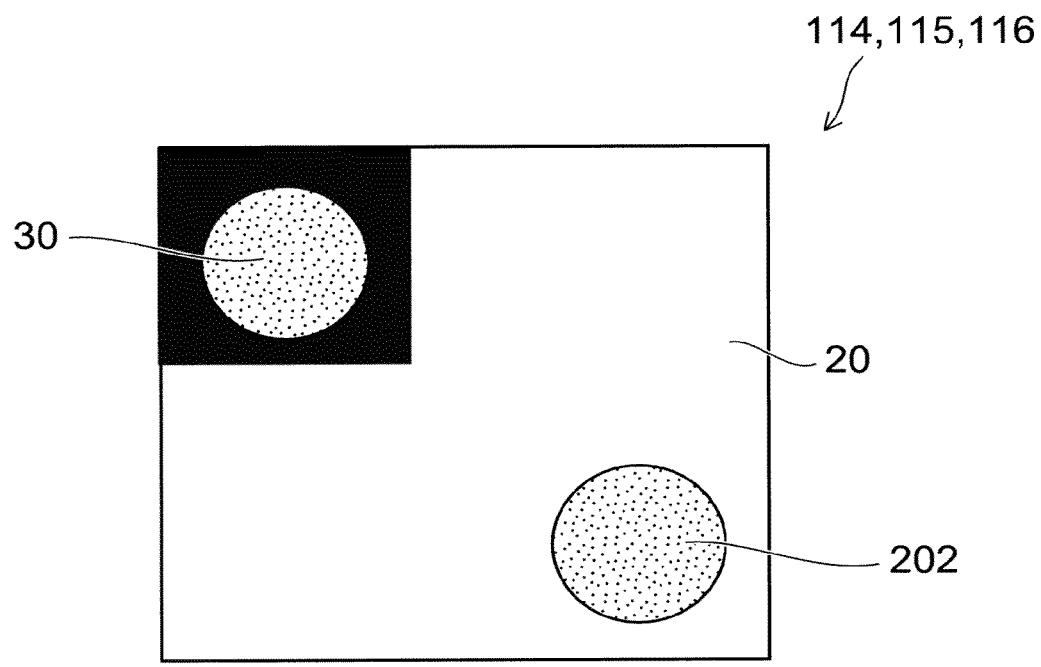

FIG. 8B illustrates the light emitting state of the semiconductor light emitting devices 114 to 116 according to the fourth to the sixth examples.

In both illustrations, black indicates a dark point and lighter tone indicates stronger luminous intensity in the part of the light extraction face, except from the pad electrode 202.

As illustrated in FIG. 8A, in semiconductor light emitting device 194, the luminous intensity was strong only near the pad electrode 202, and the farther from the pad electrode 202 the weaker the luminous intensity.

On the other hand, as illustrated in FIG. 8B, in the semiconductor light emitting devices 114 to 116, a uniform luminous intensity was obtained from near the pad electrode 202 to distant parts.

The embodiments have been described above, but the invention is not limited to these examples. For example, the second electrode layer 30 provided on the front face or the reverse face of the structure body 100 may contain the plurality of opening portions 21 similar to the first electrode layer 20. Also, in the description, the first conductivity type is n-type, and the second conductivity type is p-type, but the first conductivity type may be p-type, and the second conductivity type may be n-type.

Note that in this specification, the term, "nitride semiconductor" includes semiconductors of all compositions represented by the formula $In_xAl_yGa_{1-x-y}N$ (where $0 \le x \le 1$, $0 \le y \le 1$, and $x+y \le 1$) or $B_xIn_yAl_zGa_{1-x-y-z}N$ (where $0 \le x \le 1$, $0 \le y \le 1$, $0 \le z \le 1$, and $x+y+z \le 1$), wherein composition ratios of x, y, and z. Furthermore, with the formula described above, "nitride semiconductors" shall also be understood to include semiconductors including group V elements other than N (nitrogen), semiconductors including various elements other than N (nitrogen) in order to control various physical properties such as conductivity type and the like, and semiconductors including unintentional elements other than N (nitrogen).

As described above, according to the semiconductor light emitting device and manufacturing method of the embodiment, it is possible to increase the light emission efficiency (light extraction efficiency) while maintaining a uniform spread of current in the semiconductor layers.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
a first semiconductor layer of a first conductivity type;
a first electrode layer including a metal portion having a plurality of opening portions, the metal portion having a thickness of not less than 10 nanometers and not more than 50 nanometers along a direction from the first semiconductor layer toward the first electrode layer, the plurality of opening portions penetrating the metal portion along the direction, each of the opening portions having an equivalent circle diameter of each shape of the opening portions when viewed along the direction, the equivalent circle diameter being not less than 10 nanometers and not more than 5 micrometers;
a light emitting layer provided between the first semiconductor layer and first electrode layer;
a second semiconductor layer of a second conductivity type provided between the light emitting layer and the first electrode layer;
a third semiconductor layer of the second conductivity type provided between the second semiconductor layer and the first electrode layer; and
a second electrode layer connected to the first semiconductor layer,
the equivalent circle diameter of each respective of the opening portions being equal to $2 \times (Area/\pi)^{1/2}$, the Area being an area of the respective opening portion,
wherein an interface between the first electrode layer and the third semiconductor layer includes a dopant, and
wherein the first electrode layer is made of at least one metal or an alloy selected from the group consisting of Au, Ag, Al, Zn, Zr, Pt, Rh, Ni, Pd, Cu, Sn, C, Mg, Cr, Te, Se and Ti.

2. The device according to claim 1, wherein the metal portion is in ohmic contact with the third semiconductor layer.

3. The device according to claim 1, wherein the sheet resistance value of the third semiconductor layer is $10^4$ ohms/square.

4. The device according to claim 1, wherein the third semiconductor layer is GaP doped with an impurity.

5. The device according to claim 1, wherein an impurity doped into the third semiconductor layer includes one of C, Ca, Ge, Mg, Mn, Se, Si, Sn, Te and Zn.

6. The device according to claim 1, wherein a thickness of the third semiconductor layer is not less than 10 nm and not more than 20 nm.

7. The device according to claim 1, wherein the equivalent circle diameter of each of the opening portions is not more than ½ of a center wavelength of light generated in the light emitting layer.

8. The device according to claim 1, wherein the equivalent circle diameter of each of the opening portions is not more than 0.9 times of a gap between adjacent two of the opening portions.

9. The device according to claim 1, wherein the sheet resistance value of the third semiconductor layer is 100 times or more of the sheet resistance value of the metal portion.

10. The device according to claim 1, wherein the dopant is zinc.

* * * * *